(12) United States Patent
Taylor, IV et al.

(10) Patent No.: US 9,513,657 B2
(45) Date of Patent: Dec. 6, 2016

(54) METHOD AND APPARATUS TO IMPROVE REEL FEEDER EFFICIENCY

(71) Applicant: Raytheon Company, Waltham, MA (US)

(72) Inventors: W. Royce Taylor, IV, Nashua, NH (US); Ryan J. Koller, Bedford, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 14/527,900

(22) Filed: Oct. 30, 2014

(65) Prior Publication Data

US 2015/0096163 A1 Apr. 9, 2015

Related U.S. Application Data

(62) Division of application No. 12/877,501, filed on Sep. 8, 2010, now Pat. No. 8,893,761.

(51) Int. Cl.
| H05K 13/02 | (2006.01) |
| H05K 13/04 | (2006.01) |
| B23P 11/00 | (2006.01) |
| G05G 5/04 | (2006.01) |

(52) U.S. Cl.
CPC .............. *G05G 5/04* (2013.01); *H05K 13/021* (2013.01); *H05K 13/0417* (2013.01); *Y10T 29/49826* (2015.01); *Y10T 74/206* (2015.01); *Y10T 156/1994* (2015.01)

(58) Field of Classification Search
CPC .... H05K 13/0417; H05K 13/021; G05G 5/04; Y10T 74/206; Y10T 156/1994; Y10T 29/49826; Y10T 29/49828; Y10T 29/49829

USPC ..... 242/538.2, 538.3, 543, 564.4; 226/8, 76, 226/120, 139, 141, 142, 148, 157; 156/701, 156/750, 767; 414/411, 416.08; 221/25, 71, 72, 221/79, 81, 87, 88
See application file for complete search history.

(56) References Cited

U.S. PATENT DOCUMENTS

| 2,831,570 A | 4/1958 | Conrad |
| 5,588,614 A | 12/1996 | Takada et al. |
| 6,513,563 B1 | 2/2003 | Ando et al. |
| 7,713,376 B2 * | 5/2010 | Larsson ............... H05K 13/021 156/65 |
| 8,893,761 B2 * | 11/2014 | Taylor, IV ......... H05K 13/0417 156/767 |
| 2004/0200578 A1 * | 10/2004 | Ju ...................... H05K 13/0417 156/765 |

(Continued)

FOREIGN PATENT DOCUMENTS

| JP | 05132204 A | 5/1993 |
| JP | 2000059097 | 2/2000 |

OTHER PUBLICATIONS

PCT Search Report of the International Searching Authority for PCT-US2011/047043 dated Nov. 14, 2011, 4 Pages.

(Continued)

*Primary Examiner* — Essama Omgba
(74) *Attorney, Agent, or Firm* — Daly, Crowley, Mofford & Durkee, LLP

(57) ABSTRACT

In one aspect, a device includes a first portion having a length substantially the same as a length of a gap of a slot of a free link of a reel feeder. The device is configured to be placed in the gap to limit movement of a take-up arm along the slot. In another aspect, a method includes placing a device in a gap of a slot of a free link of a reel feeder to limit movement of a take-up arm along the slot.

5 Claims, 7 Drawing Sheets

(56) References Cited

U.S. PATENT DOCUMENTS

| | | | | |
|---|---|---|---|---|
| 2007/0241028 A1* | 10/2007 | Larsson | ............... | H05K 13/021 206/714 |
| 2012/0055280 A1* | 3/2012 | Taylor, IV | ......... | H05K 13/0417 74/522 |
| 2013/0056156 A1* | 3/2013 | Taylor, IV | ......... | H05K 13/0417 156/538 |
| 2013/0284380 A1* | 10/2013 | Tsai | ..................... | B65H 37/002 156/750 |
| 2014/0060749 A1* | 3/2014 | Choi | .................. | H05K 13/0417 156/719 |
| 2014/0150256 A1* | 6/2014 | Kanai | .................... | H05K 13/02 29/832 |
| 2014/0318713 A1* | 10/2014 | Wiley | .................. | B32B 43/006 156/701 |
| 2015/0096163 A1* | 4/2015 | Taylor, IV | ......... | H05K 13/0417 29/428 |
| 2015/0181776 A1* | 6/2015 | Kawaguchi | ........ | H05K 13/0417 221/71 |
| 2015/0382523 A1* | 12/2015 | Hwang | ................ | B65H 37/002 414/412 |
| 2016/0185093 A1* | 6/2016 | Ohashi | ............... | H05K 13/0417 156/378 |
| 2016/0192547 A1* | 6/2016 | Ohashi | ............... | H05K 13/0417 242/566 |
| 2016/0192548 A1* | 6/2016 | Ohashi | ............... | H05K 13/0417 156/750 |

OTHER PUBLICATIONS

PCT Written Opinion of the International Searching Authority for PCT/US2011/047043 dated Nov. 14, 2011, 5 Pages.
PCT International Preliminary Report on Patentability for PCT/US2011/047043 dated Mar. 21, 2013, 6 Pages.
U.S. Appl. No. 12/877,501, filed Sep. 8, 2010.

* cited by examiner

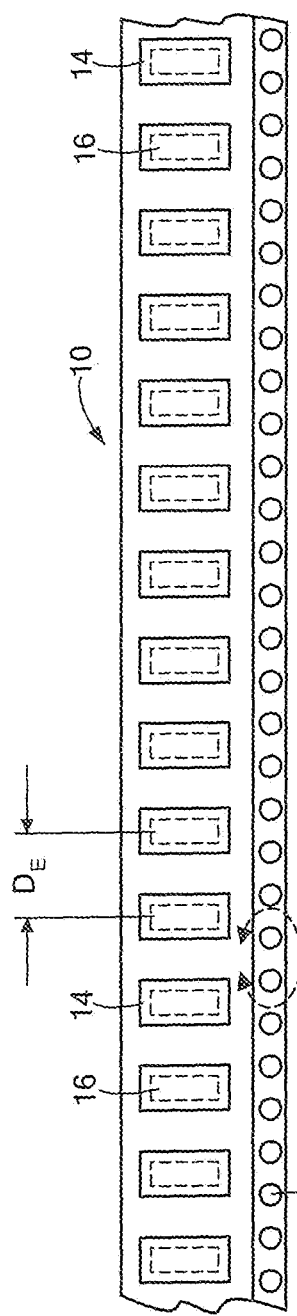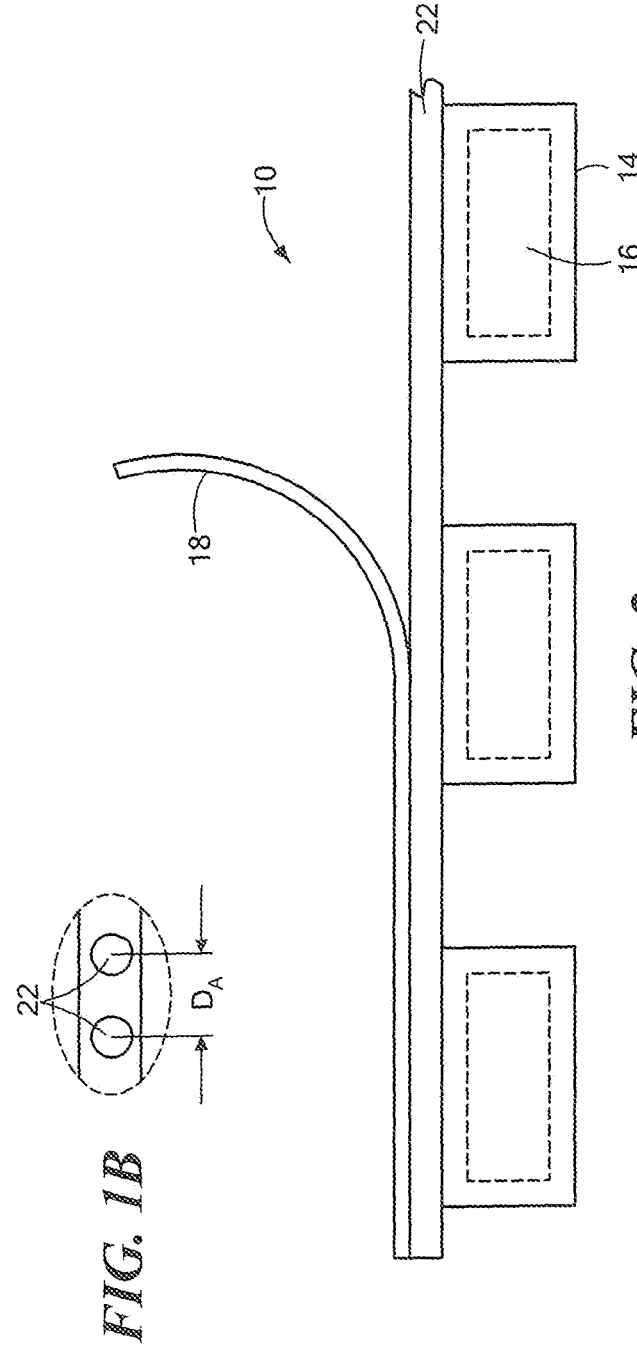

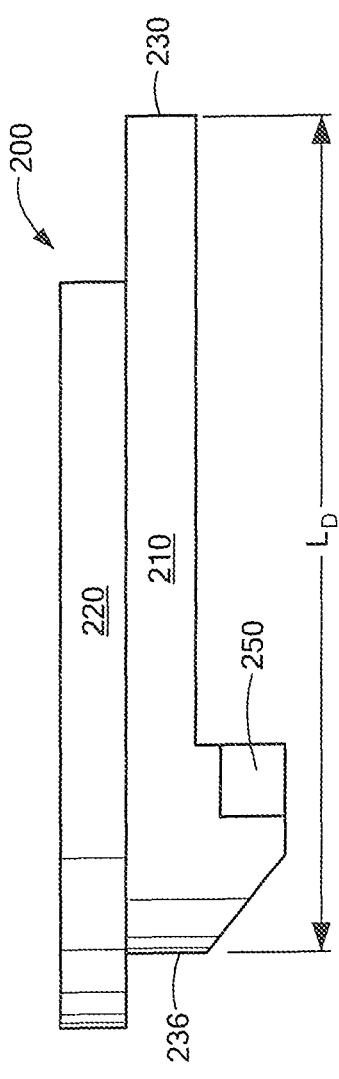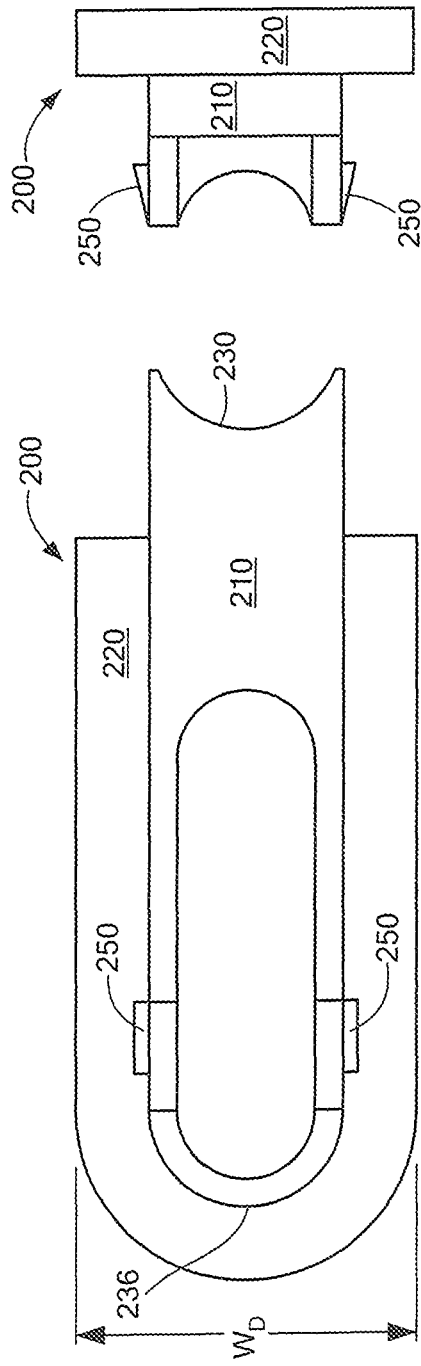
FIG. 4E
FIG. 4D
FIG. 4C

METHOD AND APPARATUS TO IMPROVE REEL FEEDER EFFICIENCY

RELATED APPLICATIONS

This application is a divisional application of U.S. patent application Ser. No. 12/877,501 filed on Sep. 8, 2010, now issued as U.S. Pat. No. 8,893,761, which is incorporated herein by reference in its entirety.

BACKGROUND

Electronic components (e.g., integrated circuits (ICs)) are supplied from vendors in tape-and-reel packaging. Typically, the electronic components are stored in cavities along a feeder tape and covered by a cover tape. The feeder tape is wrapped onto reels similar to movie film being wrapped on to movie reels making for easy storage.

A reel feeder is used to provide access to the electronic components for automated pick-and-place machinery used during the assembly process of Surface Mount Technology (SMT) circuit cards, for example. One of the critical functions of the reel feeder is to peel back the cover tape to expose the electronic components while feeding the electronic parts to the pick-and-place machinery. Any failure to remove the cover tape results in the pick-and-place machinery being unable to pickup the electronic components. Thus the electronic components are lost during processing, leading to elevated levels of electronic component attrition, increased production cost, and delays in production.

SUMMARY

In one aspect, a device includes a first portion having a length substantially the same as a length of a gap of a slot of a free link of a reel feeder. The device is configured to be placed in the gap to limit movement of a take-up arm along the slot. In another aspect, a method includes placing a device in a gap of a slot of a free link of a reel feeder to limit movement of a take-up arm along the slot.

One or more of the aspects above may include one or more of the following features. The length of the gap of the slot corresponds to a pitch of a feeder tape. The device is configured to be placed in the gap to limit movement of a take-up arm along the slot. The device further includes a second portion connected to the first portion having a width greater than a width of the slot. The first portion includes an end shaped in a concave-type manner and configured to engage a fastener securing a take-up arm to the slot. The first portion includes retention tabs used in securing the device in the slot. The length of the device corresponds to a pitch of a reel tape. A color of the device corresponds to the length of the device.

DESCRIPTION OF THE DRAWINGS

FIG. 1A is a top view of a feeder tape.

FIG. 1B is another view of the feeder tape along the line FIG. 1B in FIG. 1A.

FIG. 2 is a side view of the feeder tape with the cover tape partially retracted.

FIGS. 4A to 4E are different views of an example of a device used to improved reel feeder efficiency.

DETAILED DESCRIPTION

Figure 3A:
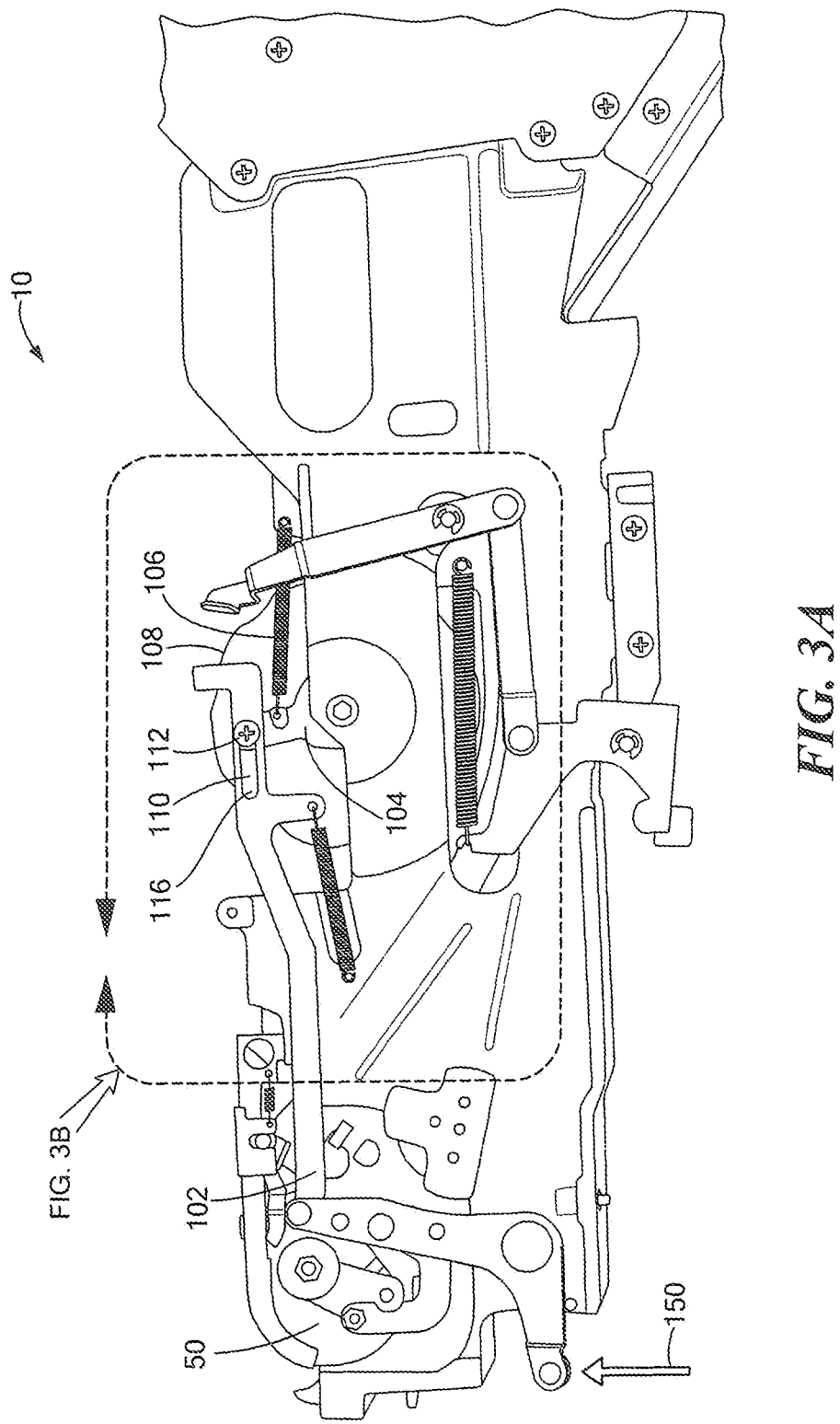
FIG. 3A is a view of a reel feeder.

Referring to FIGS. 1 and 2, a feeder tape 10 includes cavities 14 that hold electronic components (e.g., an electronic component 16). The tape includes holes 22 configured to engage a tape feed sprocket (see, for example. a tape feed sprocket 50 in FIG. 3A) on a reel feeder (e.g., a reel feeder 100 (FIG. 3A)). The holes 22 are each spaced apart by a distance, $D_A$, of about 4 mm. In general, a distance, $D_E$, is associated with a pitch (also called a feeder pitch) such that the greater the distance $D_E$, the greater the pitch.

As shown in FIG. 2, cover tape 18 is used to cover the electronic components 16 until they are ready to be picked (usually by pick-and-place machinery). The cover tape 18 is peeled away or retracted from a tape body 32 to expose the electronic components 16 in the cavities 14. Generally, the cover tape 18 is retracted by the reel feeder. Typically, the cover tape 18 is adhered to the tape body 32 using adhesives.

Figure 3B:
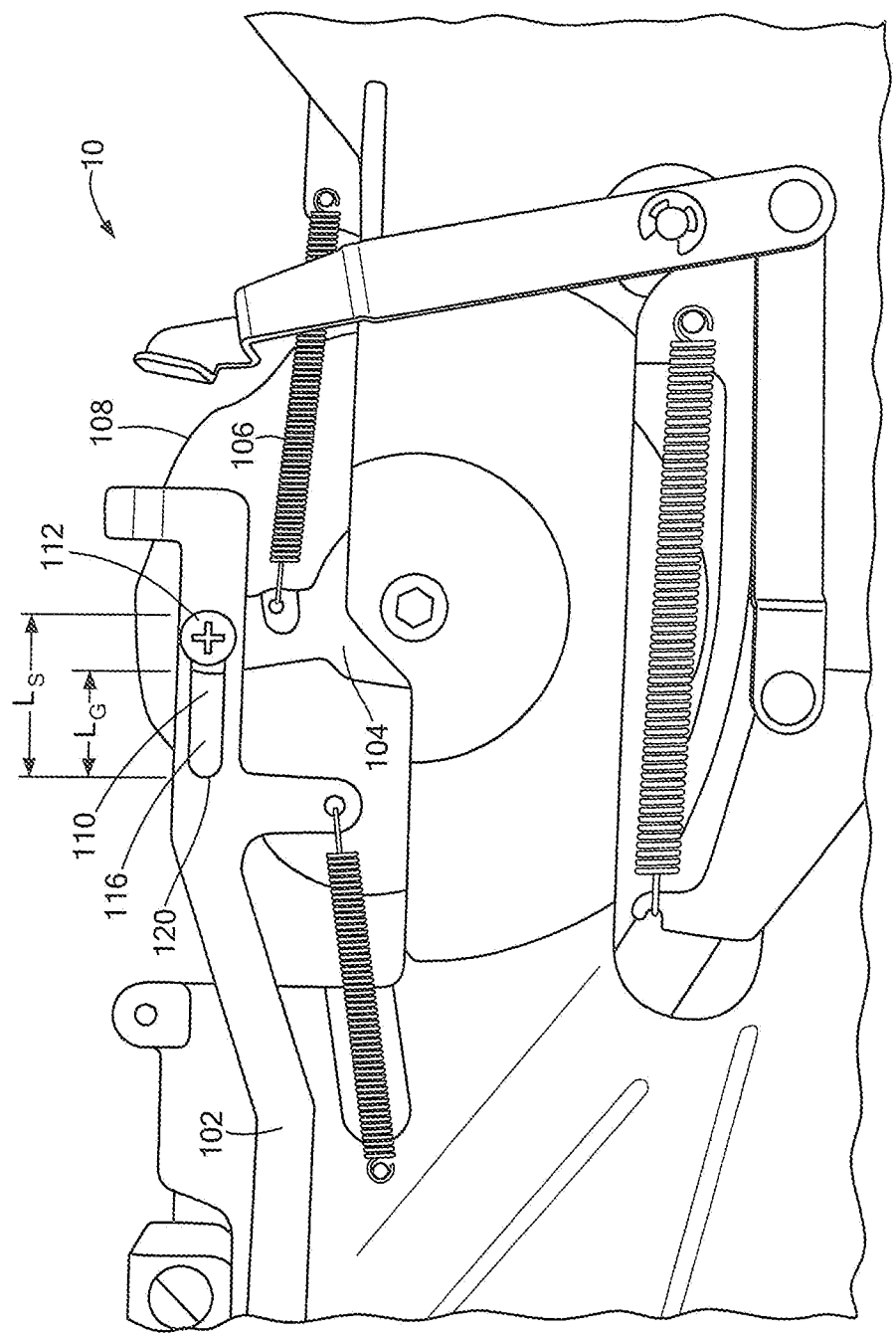
FIG. 3B is another view of the reel feeder along the line 3B in FIG. 3A.
Figure 4A:
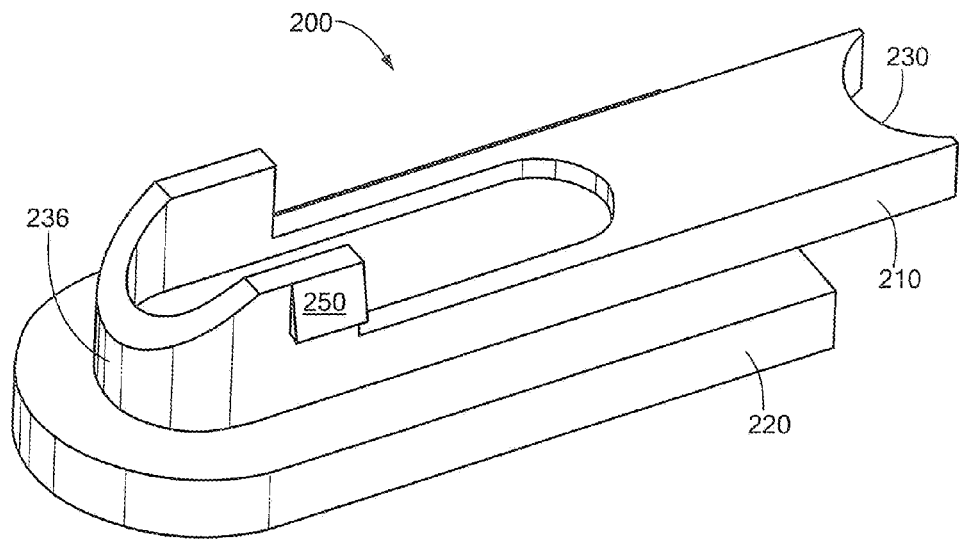
Figure 4B:
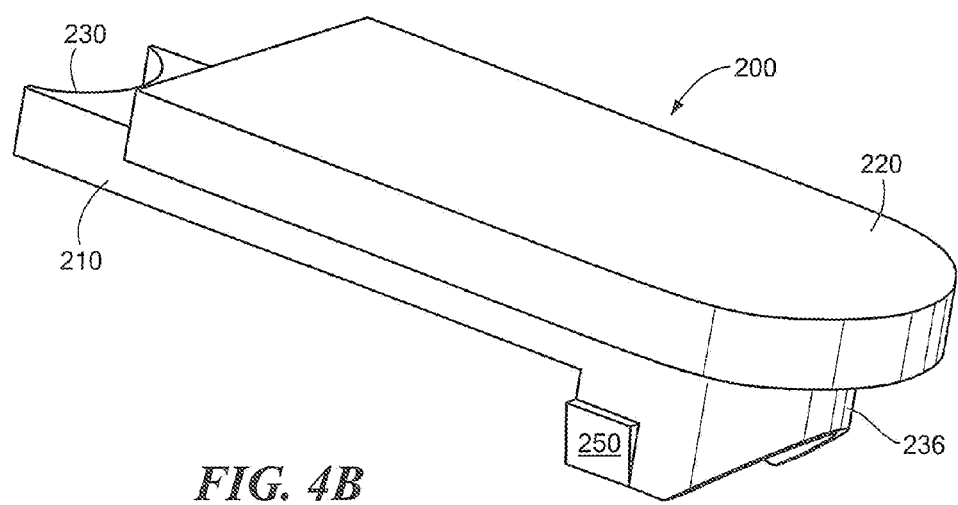

FIGS. 3A and 3B depicts the reel feeder 100 used to access the electronic components 14 on the feeder tape 10 by retracting the cover tape 18. The reel feeder 100 includes a free link 102, a take-up arm 104, a take-up spring 106 and a take-up spool 108. The free link 102 includes a slot 110 for which the take-up arm 104 is secured by a fastener 112 (e.g., a screw and bushing). The slot 110 has a length $L_S$. The length of a gap 116 in the slot 110 between a first end 120 of the slot and the fastener 112 is a length $L_G$. The width of the slot 110 is a width, $W_S$.

The reel feeder 100 is engaged by a pick-and-place machine (not shown). For example, the pick-and-place machinery applies a force on the free link 102 in an upward direction 150 and the free link 102 is driven aftward allowing the take-up arm 104 to be pulled back by the take-up spring 106. The take-up spring 106 acts on the take-up arm 104 to rotate the take-up spool 108, which in turn puts tension on the cover tape 18 to retract it from the feeder tape 10. If the cover tape 18 requires a greater retraction force than the take-up spring 106 can provide (sometimes caused when the adhesive holding the cover tape 18 to the tape body 32 has a stronger adhesive bond), then the take-up arm 104 with the fastener 112 slips along the slot 110 towards the end 120 and the reel feeder 100 advances to the next electronic component 16 but fails to retract the cover tape 18. Without removing the cover tape 18, the pick-and-place machinery cannot access the covered electric components 16 resulting in lost electronic components, higher costs, and production delays.

There is currently no method for addressing cover tapes 18 that have excessive bonding adhesives. In one example, the automated pick-and-place machinery will error out after two missed picks at which time an operator will manually retract the cover tape 18 and restart the pick-and-place machine. This method results in scrapping out every third electronic component, such that one electronic component is scraped for every two that is placed.

However, the slot 110 exists because the reel feeder 100 is required to accommodate a variety of feeder tape pitches, which means that the reel feeder 100 must provide flexibility relating to how far the take-up arm 104 travels when fired under the various different pitch settings. For example, the take arm 104 is secured by fastener 112 and rides along the length of the slot 110 based on the pitch. This "slip joint" allows variability in the travel distance.

Referring to FIGS. 4A to 4E, a device 200 is used to prevent the movement of the take-up arm 104 along the slot 110. The device 200 fills the slot 110 which results in the take-up arm 104 being driven directly by the free link 102 (in addition to the tension provided by the take-up spring 106). The free link 102 is directly driven by a pneumatic piston on the pick-and-place machinery and generates a force which is substantially greater than any forces developed by the take-up spring 106. Having this direct drive on the take-up arm 104 virtually eliminates the failure mode resulting from inadequate retraction of the cover tape 18.

As described above the fastener 112 and take-up arm 104 slide along the length of the slot 110 to accommodate the variable feeder pitch settings. The device 200 may be embodied in a variety of lengths in order to accommodate these various required pitch settings. Thus, which length of the device 200 the user will use will depend on the current pitch setting of the reel feeder 100.

In particular, the device 200 includes a first portion 210 and a second portion 220. The first portion 210 has a length $L_D$ (FIG. 4D) which is less than or equal to the length $L_G$ of the gap 116 in the slot 110. The first portion 210 includes a first end 230 that is concave shaped and configured to engage the fastener 112. The first portion 210 also includes a second end 236 opposite the first end 230 that is configured to engage the second end 120 of the gap 116.

The first portion 210 also includes "snap-fit" retention tabs 250 used to hold device 200 after it is installed. For example, when the operator installs a device 200 onto a feeder 100 the walls of the free link 102 surrounding the gap 116 of the slot 110 exert a force on the retention tabs 250 which causes the retention tabs to flex as the device 200 enters the 110 slot. Once the device 200 is fully seated into slot 110, then the retention tabs 200 are no longer under a load and spring back to their initial shape, allowing the retention tabs 250 to form an interference fit with the gap 116 of the slot 110, thereby retaining the device 200 in place.

The second portion 220 connected to the first portion 210 has a width $W_D$ (FIG. 4C) that is greater than the width $W_S$ of the slot 110 thereby adding structure that also can hold the device 210 secure in the gap 116. Thus, the device 200 is configured to fill, or partially fill and to fit securely in the gap 116.

In one example, devices 200 are color schemed based on their length $L_D$ which corresponds to a pitch. For example, a device used for a 12 pitch setting is green while a 4 and 8 pitch setting has a device 200 that is red.

Figure 5A:
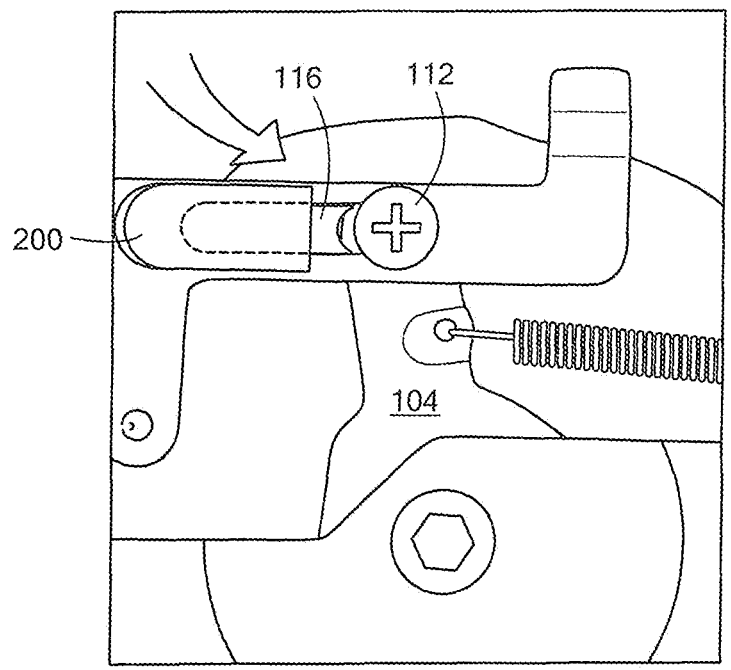
FIGS. 5A to 5C are views of an example method of installing the device on the reel feeder.
Figure 5B:
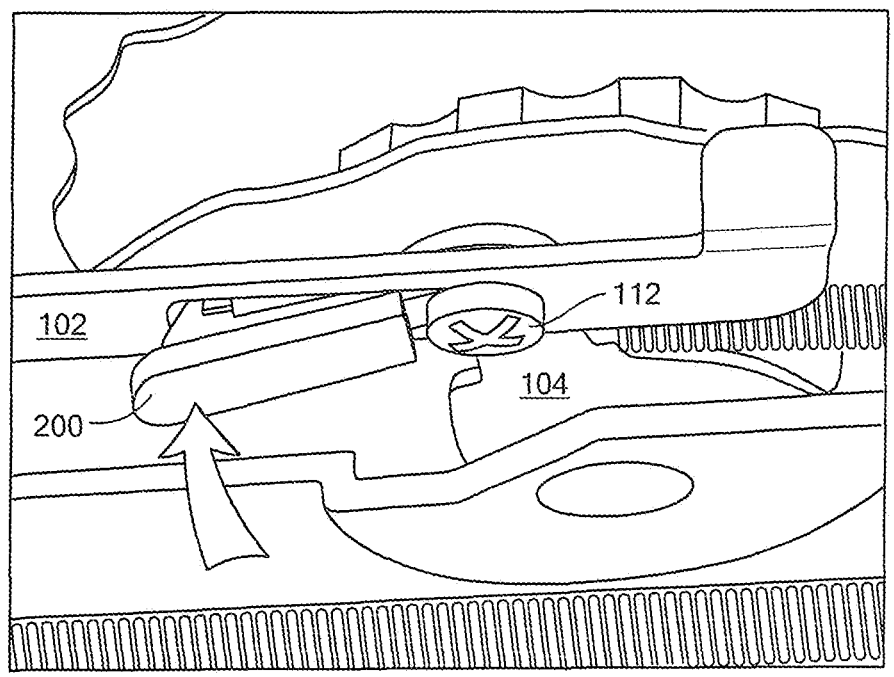
Figure 5C:
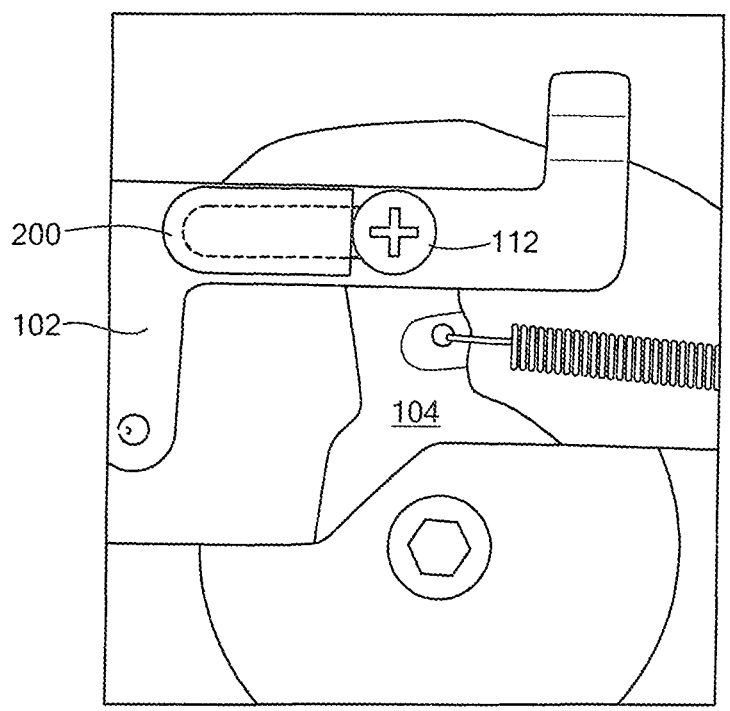

Referring to FIGS. 5A to 5C, the device 200 is installed and removed without the need for any tools or additional hardware. A user slides the device 200 into the gap 116 (FIG. 5A), presses down on the device 200 (e.g., using a thumb) (FIG. 5B) which results in the device 200 being secured in the gap 116 (FIG. 5C).

Elements of different embodiments described herein may be combined to form other embodiments not specifically set forth above. Other embodiments not specifically described herein are also within the scope of the following claims.

What is claimed is:

1. A method, comprising:
   placing a device in a gap of a slot of a free link of a reel feeder to limit movement of a take-up arm along the slot,
   wherein placing the device comprises:
      using a concave-shaped end of the device to engage a fastener of the reel feeder;
      using retention tabs of the device to secure the device in the slot, wherein the device is configured to extend from an end of the slot to the fastener, wherein the reel feeder comprising:
         a take-up arm;
         a take-up spool;
         a take-up spring configured to apply a force on the take-up arm to rotate the take-up spool; and
         a free link having a slot and the fastener disposed through the slot and configured to secure the take-up arm, a location of the fastener along the slot corresponding to a feeder pitch setting; and
      using the device to restrict movement of the fastener and the take-up arm along the slot and to enable the take-up arm to be driven directly by the free link.

2. The method of claim 1 wherein placing the device comprises placing a device in a gap of a slot of a free link of a reel feeder corresponding to a pitch of a feeder tape.

3. The method of claim 1, further comprising providing the device comprising a first portion having a length substantially the same as a length of the gap.

4. The method of claim 3 wherein providing the device comprises providing a device further comprising a second portion connected to the first portion having a width greater than a width of the slot.

5. The method of claim 1 wherein providing the device comprises selecting a device having a length corresponding to a pitch of a reel tape.

* * * * *